United States Patent [19]
Harmeling

[11] Patent Number: 5,134,591
[45] Date of Patent: Jul. 28, 1992

[54] SURVIVAL SEISMIC DETECTION SYSTEM HAVING IMPROVED TUNABLE FILTER

[75] Inventor: Jay S. Harmeling, Glen Burnie, Md.

[73] Assignee: Westinghouse Electric Corp., Pittsburgh, Pa.

[21] Appl. No.: 660,079

[22] Filed: Feb. 25, 1991

[51] Int. Cl.5 ............................................. H04B 1/06
[52] U.S. Cl. .................................... 367/135; 367/901
[58] Field of Search ................................. 367/135, 901

*Primary Examiner*—Daniel T. Pihulic
*Attorney, Agent, or Firm*—John K. Williamson; Thomas H. Martin

[57] ABSTRACT

A survival detection system distinguishes a low frequency survivor generated signal component from ambient low frequency signal components in a seismic sensor signal output. A twin-tee filter circuit a has its input coupled to the sensor signal output and it has a plurality of interconnected charging resistor and capacitor components with an output circuit coupled thereto to generate the detected survivor signal component.

A CMOS switch is connected in each charging current path between the associated resistor and capacitor in such path to control the capacitor charging currents. A bandwidth control circuit applies an adjustable feedback voltage from filter output circuit to the twin-tee filter.

A variable duty cycle generator controls the on-off duty cycle of the CMOS switches to control the effective charging current path resistance and thereby the capacitor charging currents and the tuned or center frequency of the filter. The variable duty cycle generator includes an oscillator having a relatively high frequency output applied to a comparator against a floating variable voltage reference. Variation of the voltage reference produces a comparator output with variable on-off cycling which accordigly operates as a duty cycle control for the CMOS switches and ultimately as filter frequency control.

22 Claims, 6 Drawing Sheets

...

SURVIVAL SEISMIC DETECTION SYSTEM HAVING IMPROVED TUNABLE FILTER

BACKGROUND OF THE INVENTION

The present invention relates to the detection of persons trapped in mining disasters or building or other structural collapses caused by earthquake or other destructive forces. More particularly, the invention relates to seismic instrumentation structured to provide improved detection of tapping signals made by a trapped person who has survived a disaster.

In 1989, a study was made of existing seismic sensors and signals like those occurring at structural disaster locations to determine how to facilitate differentiation of ambient seismic noise from tapping or similar signals. In the study, ambient noise typically caused the seismic sensor to generate a low frequency oscillatory or ringing signal, typically about 30 Hz. The exact value of the ambient signal frequency will vary according to the particular seismic sensor employed and other factors.

A simulated discrete tapping signal, such as that which would be caused by a survivor's foot tapping on the ground, typically caused momentary detected signal components of about 22 Hz to 44 Hz. However, the tapping signal may vary in frequency within a relatively narrow low frequency range, and further it may be difficult to detect because of the strength of the ambient noise.

The present invention is directed to resolving this detection problem by providing a seismic detection system in which characteristic survivor tapping signals are enhanced relative to ambient noise signals to provide greatly improved detection capability.

SUMMARY OF THE INVENTION

A survival detection system is provided with the capability of detecting a low frequency survivor generated signal component from ambient low frequency signal components in a seismic sensor signal output. The detection system includes a filter circuit means to which the sensor signal output is applied for detection of the survivor generated signal component. The filter circuit means has a plurality of interconnected charging resistor and capacitor components and an output circuit is coupled to the resistor and capacitor components to generate the detected survivor signal component.

The detection system further includes switch means connected in charging current paths from the resistors to the capacitors to control the capacitor charging currents. The on-off duty cycle of the switch means is controlled thereby providing control over the effective charging current path resistance, the capacitor charging currents and the tuned or center frequency of the filter circuit means.

BRIEF DESCRIPTION OF THE DRAWINGS

The accompanying drawings, which are incorporated in and constitute a part of this specification illustrate one embodiment of the invention and together with the description provide an explanation of the objects, advantages and principles of the invention. In the drawings.

DESCRIPTION OF THE PREFERRED EMBODIMENT

Figure 1:
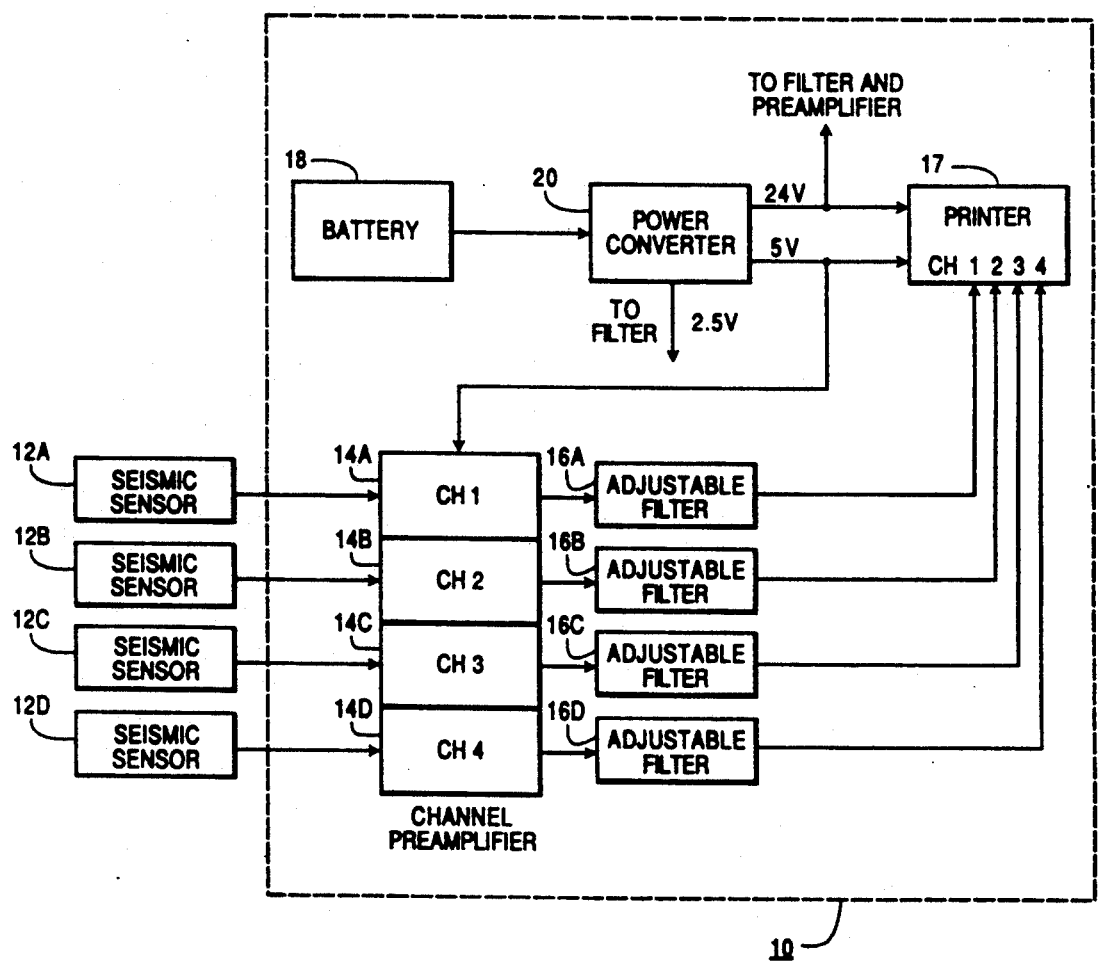
FIG. 1 shows a schematic diagram of a multichannel survival seismic detector unit arranged in accordance with the principles of the present invention to provide significantly improved capability for distinguishing survivor tapping signals from seismic noise.

More particularly, there is shown in FIG. 1 a survival detection system 10 arranged in accordance with the invention to provide improved detection of tapping signals and the like of the type that a disaster survivor is likely to send from the location at which he or she is trapped in a collapsed building or other structure. The survivor detector 10 can be manufactured as a unit for sale to fire departments and other organizations having responsibility for saving the lives of people trapped in collapsed structures as a result of earthquakes or other disasters.

In this case, the survivor detector 10 is provided with multiple detection channels, i.e. four channels. At the disaster site, a conventional seismic sensor 12A or 12B or 12C or 12D, such as a Geo Space Corporation GSll-D sensor, is connected to the input of each detector channel. The user locates the sensors 12A–12D at preselected disaster site locations.

The seismic sensor signal output normally includes ambient low frequency component(s) (dependent on the kind of seismic sensor, the source of the noise and the nature of the earth transmittal path between the ambient source and the seismic sensor—but typically around 30 Hz) and any survivor generated signal component that may exist (dependent on the same parameters—but typically around 22Hz to 44Hz for survivor tappings). Generally, seismic sensors will generate oscillatory or ringing signals in the frequency range of about 5 Hz to about 100 Hz depending on the characteristics of the vibration source and the ground transmission path.

Preamplifiers 14A–14D, such as conventional Teledyne Geotech Model 42.50 devices, are included in the respective detector channels to increase the amplitude of the input sensor signals. The preamplifier outputs are applied in the respective channels to filters 16A–16D which are adjustable and otherwise operable in accordance with the invention. In turn, the detected signal outputs from the adjustable filters 16A–16D are connected to respective channel inputs of a conventional four-channel printer 17.

The survivor detector 10 further includes a power system having a battery 18 and a power converter 20 that produces output voltages needed for operating the preamplifier circuits 14A-14D, the adjustable filter circuits 16A-16D and the printer 17. If desired, the survivor detector 10 can also include an audio detection circuit (not shown) which can be selectively coupled to the adjustable filter outputs in the respective channels to provide audio counterparts of the detected signal outputs which can be coupled to earphones worn by the user of the survivor detector 10.

THE PERTAINING PRIOR ELECTRONIC FILTER ART

Figure 3:
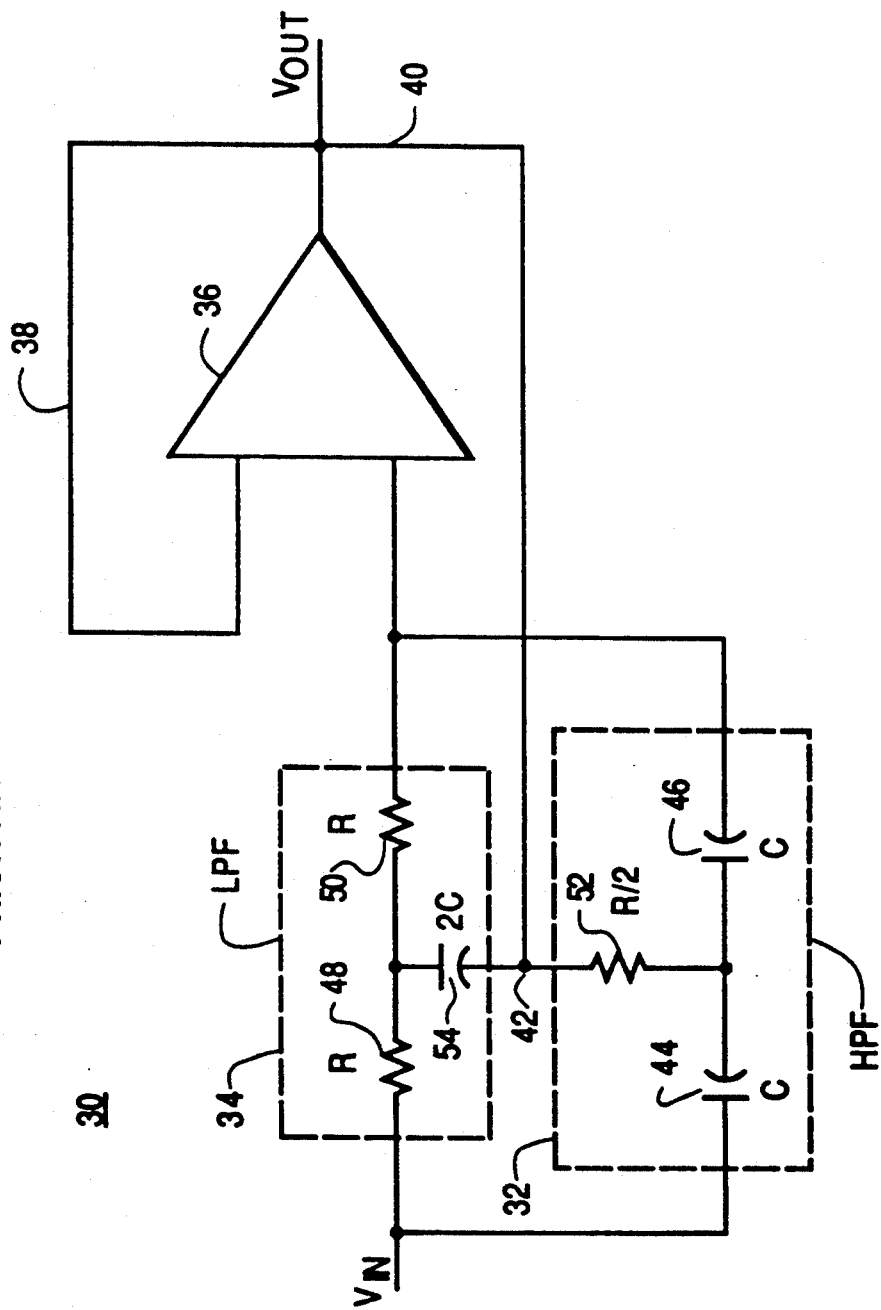
FIG. 3 shows a typical prior art twin-tee filter which is normally provided with fixed tuning and therefore is essentially unable to operate as an adjustable filter as required for improved detection of survivor tapping signals.

In FIG. 3, there is shown a prior art twin-tee filter 30 in which a tee-high pass filter circuit 32 and a tee-low pass filter circuit 34 are connected in parallel and coupled to an output amplifier 36 which has its output coupled in one feedback path 33 to one of its inputs and in another feedback path 40 to the tee-leg connection point 42 between the high and low filters 32 and 34.

In the high pass filter 32, capacitors 44 and 46 are provided with equal capacitance values C. Similarly, resistors 48 and 50 are provided with equal resistance values R in the low pass filter 34. A highpass resistor 52 has a resistance value equal to R/2, and a low pass capacitor 54 has a capacitance value equal to C/2.

When matched in frequency, the two filters 32 and 34 shift the phase of the characteristic frequency (3dB point) by +90 degrees and −90 degrees for a total of 180 degrees. The characteristic frequency is thus essentially nulled to zero while all other frequencies are passed essentially unaffected.

The twin-tee filter 30 thus can efficiently notch out a single cycle from an input signal, but it is limited by the fact that its components must be accurately balanced in tuning to a particular characteristic frequency. Minor differences in component values greatly affect the twin-tee filter Q. Accordingly, the twin-tee filter 30 is at best poorly adaptable for use as an adjustable filter in survival detector and other applications requiring filter adjustability since the filter components, specifically the three resistors, must be changed equally to change the nulled frequency.

IMPROVED ADJUSTABLE FILTER CIRCUITRY FOR SURVIVAL DETECTION SYSTEM

In the present invention, the adjustable filter circuits 16A-16D identified in FIG. 1 as part of the survival detection system 10 are essentially identical. Each filter circuit is shown as filter circuit means 16 in FIG. 2. Preferably, as embodied herein, the adjustable filter circuit means 16 is provided in the form of a twin-tee type filter having both frequency tuning and bandwidth adjustability in accordance with the present invention.

With frequency tuning adjustment, the detection of survivor generated signal components is facilitated since such signal components may vary in frequency according to signal source, signal transmittal path and seismic sensor type. Bandwidth adjustment provides added facility since broader band signal detection can expedite a survivor signal search.

At the input to the adjustable twin-tee filter 16, a differential input buffer 60, such as one of the units in a quad operational amplifier ICL 7641, is preferably provided to block common mode noise and to block out upper frequencies such as 160 cycles and above.

The output from the buffer 60 is coupled to the input of a twin-tee filter circuit 62 having center frequency adjust circuit means 64 and bandwidth adjust circuit means 66 coupled therewith.

The twin-tee output is coupled to the input of an output buffer 68 preferably in the form of a differential amplifier, such as one of the units in a quad operational amplifier ICL 7641.

Through the use of a single pole, double throw selector switch 70, such as a conventional SPDT mechanical switch, the filter circuit 16 can be selectively operated in either the band pass mode or the band stop mode. In the band pass mode, the switch is moved to its upper position where the output from the filter 62 is added to the output from the input buffer 60. In the band stop or notch out mode, the switch 70 is moved to its lower position to couple the lower input to the output buffer 68 to ground and thereby provide band stop operation.

The band pass mode is the mode that will be most used in most applications of the invention. In this mode, all signals outside the center frequency, or the frequency band to which the filter is adjusted, are attenuated by up to 20db or more.

In the band stop mode, or notch out mode, relatively strong interfering signals or interfering signal bands can be removed from the detector signal output. For example, seismic signal components caused by a nearby 60 Hz electric power station or low frequency signal components caused by trucks in the area could be notched out in the band stop mode.

Figure 4:
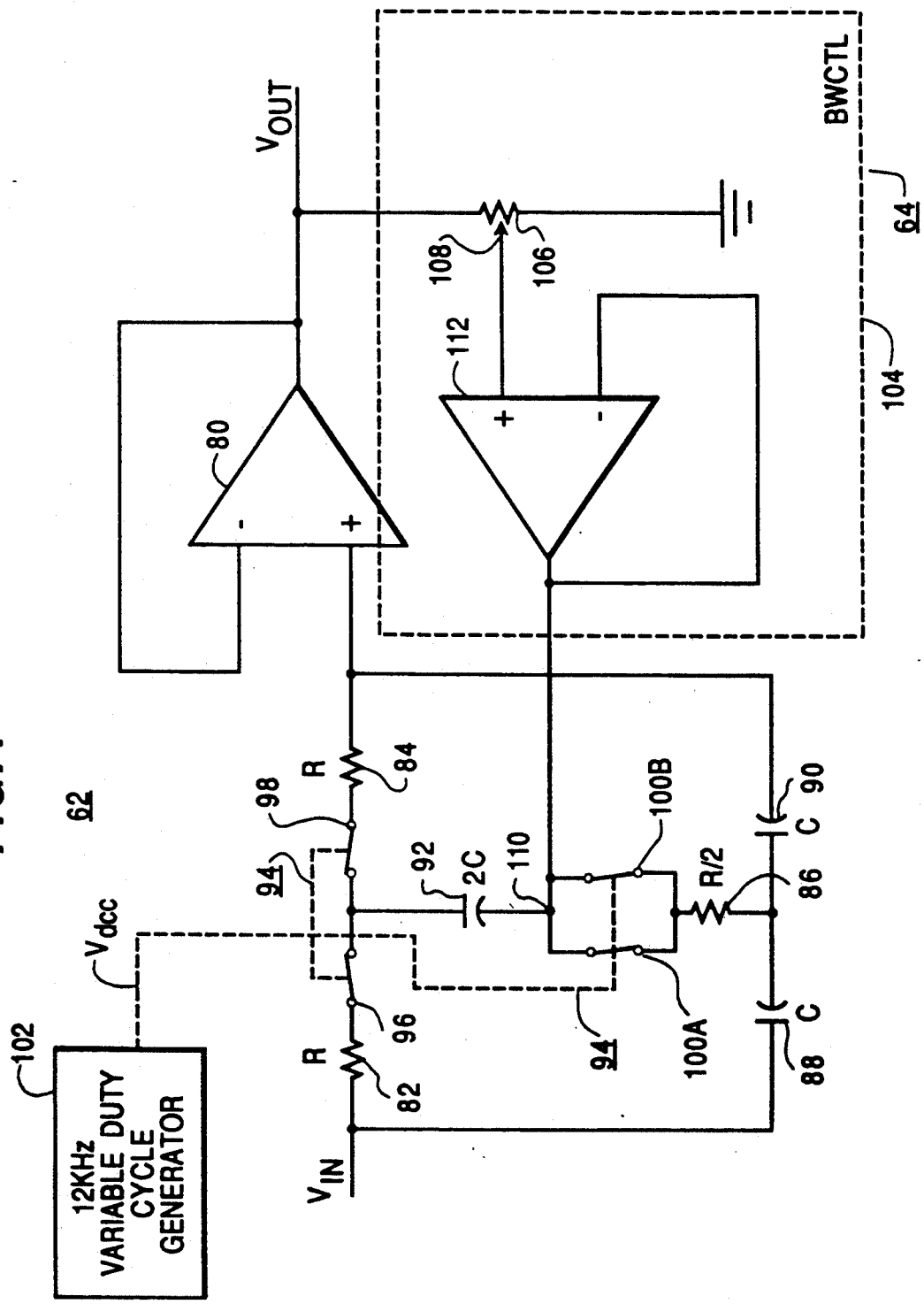
FIG. 4 shows in greater detail a tuning circuit having center or tunable frequency and bandwidth adjustability and employed in accordance with the present invention in the filter of FIG. 2.

The adjustable twin-tee filter circuit 16 is shown in even greater detail in FIG. 4. Resistors 82, 84, and 86, and capacitors 88, 90, and 92 are provided with relative values as in the case of a conventional twin-tee filter circuit and coupled to an output amplifier 80.

To provide circuit adjustments equivalent to accurately balanced resistor adjustments and thereby to provide accurate and reliable adjustment of the filter characteristic frequency, the charging currents to the capacitors in the filter circuit means 16 are controlled by switch means that operates with stable balancing. Thus, in the present embodiment, switch means 94 preferably include respective bilateral switches 96, 98, and 100A and 100B (in the form of a quad bilateral CMOS switch 4066 type, for example), connected in series with the respective filter resistors 82, 84, and 86 to provide control of the charging currents to the capacitors from the resistors through cycling operation of the switches. The two switches 100A and 100B are parallel connected to the resistor 86 to provide as much circuit balance as possible.

It is desirable that the cycling switches be as transparent to the filter circuit as possible, and for this reason the cycling switches should have a very low on-resistance and a very high off-resistance (the exemplary 4066 CMOS switch device provides these characteristics). When the duty cycle of the switching means 94 is cycled at a much higher rate (such as 12KHz) than the frequency of the seismic input signal (normally below 100Hz), the respective switches 96, 98, and 100A and 100B function with equivalence to variable resistors to provide center frequency adjustment through control of the capacitor charging currents.

The switch on-off duty cycle operates as a single highly stable adjustment to determine equal effective switch resistance values connected in series with the respective resistors 82, 84 and 86. Thus, as the switch duty cycle is varied from 1% to 99%, the apparent resistance varies from approximately 100X to 1X and the center frequency is adjusted linearly from 1/100 of the unadjusted characteristic frequency to the unadjusted characteristic frequency.

To adjust the filter Q (bandwidth) and the filter bandwidth, bandwidth control means 104 (corresponding to the block 66 in FIG. 2) are preferably provided in the form of a buffered in-phase output circuit. Thus, the output Vout is applied to a voltage divider potentiometer 106. A tap 108 of the potentiometer 106 is coupled to the common twin-tee circuit point 110 through an amplifier 112.

In operation, potentiometer adjustment varies the filter response as a percentage of selected frequency, i.e. from about a 10% bandwidth response about 60% bandwidth response relative to the selected frequency. The single potentiometer adjustment provides linear bandwidth adjustment without unbalancing the twin-tee filter parameters. As an example, if the selected frequency is 30 Hz and the bandwidth is set to 40%, the result is a 12 Hz bandwidth or a 30 Hz±6 Hz with $Q = 30/12 = 2.5$.

VARIABLE DUTY CYCLE GENERATOR

Figure 2:
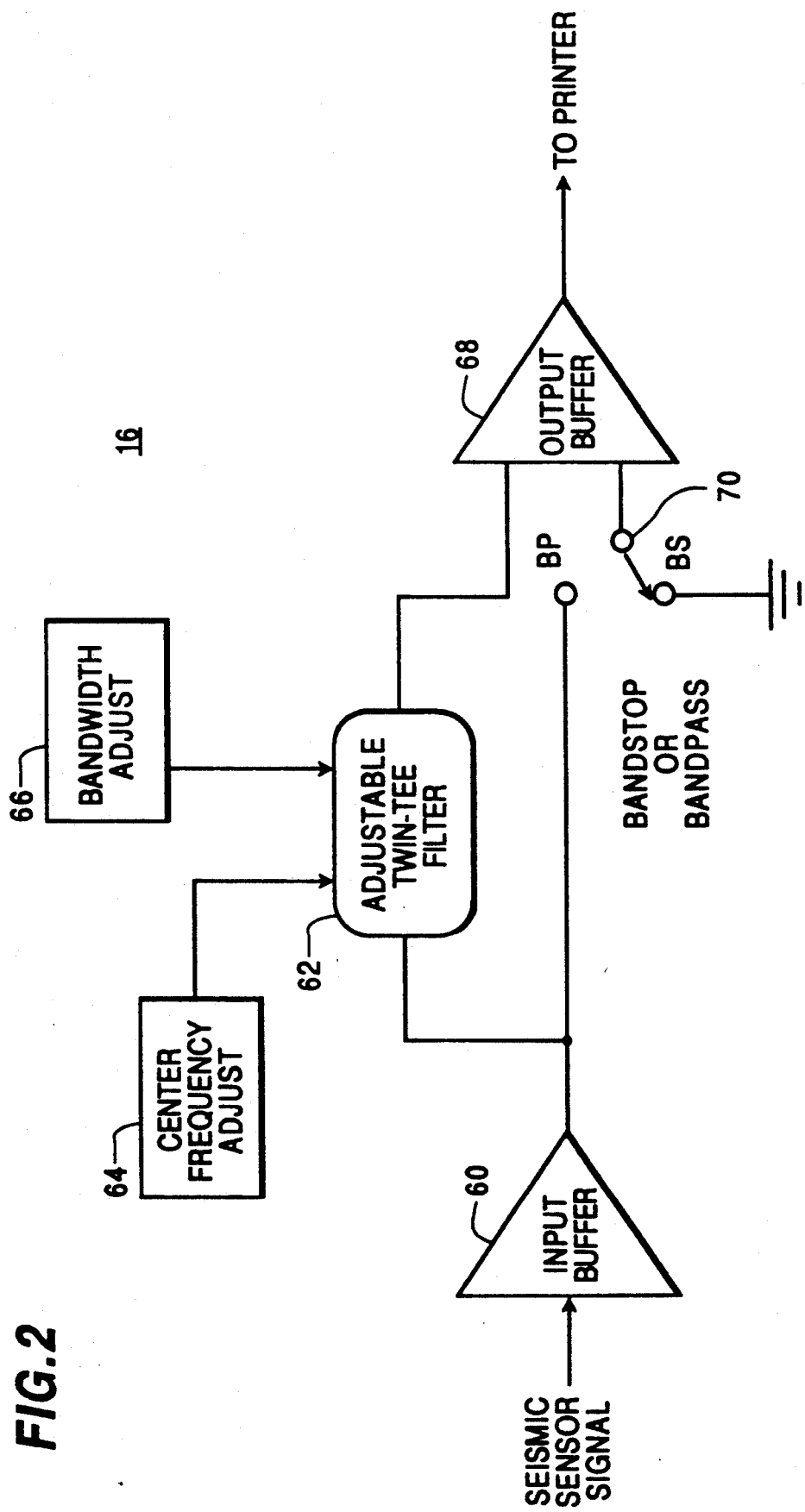
FIG. 2 shows an adjustably tunable filter employed in each channel of the detector unit shown in FIG. 1.
Figure 5:
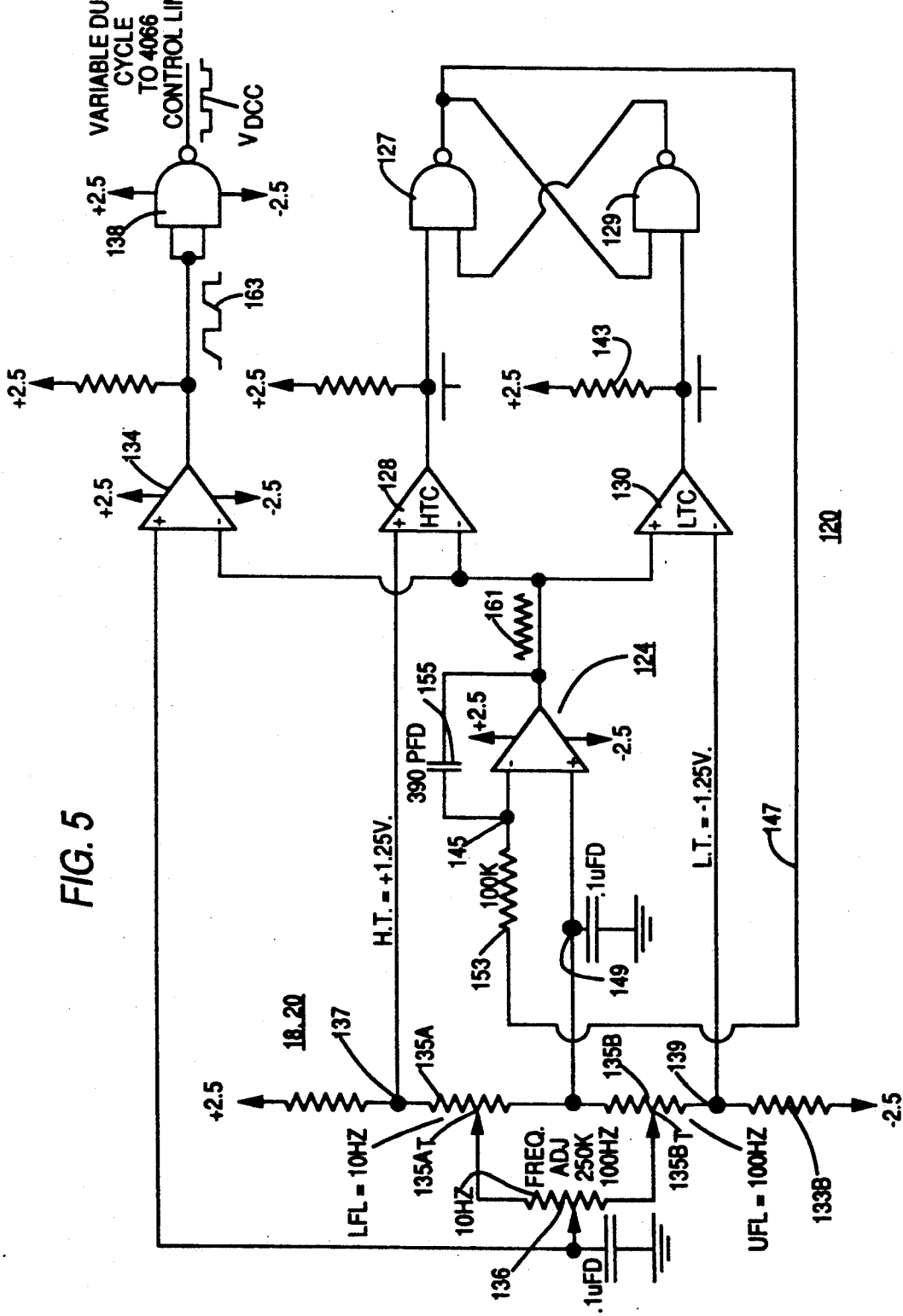
FIG. 5 shows a schematic diagram of a variable duty cycle generator circuit employed in the adjustable tuning circuit of FIG. 4.

The means employed for controlling the duty cycle of the filter switch means 94, and thereby for achieving filter passing or notching operation as narrow as a single cycle, is a variable duty cycle generator means preferably provided in this embodiment as a variable duty cycle generator 102 (FIG. 2). The generator 102 preferably comprises an oscillator circuit 120 shown in FIG. 5 (corresponding to block 64 of FIG. 2).

In the oscillator 120, an integrator amplifier 124 operates a ramp output that drives a high threshold (HT) comparator 128 and a low threshold (LT) comparator 130 referenced in this case respectively to a $+1.25V$ polarity and a $-1.25V$ polarity derived from the power supply 18, 20 through a voltage divider 132.

In turn, the threshold comparators 128 and 130 drive an oscillator driving switch preferably in the form of a pair of NAND gates 127 and 129 configured as a set/reset latch. Resistors 141 and 143 (such as 10K devices) are operated as pull up resistors for the respective comparators 128 and 130.

The output from the set/reset latch or switch 127, 129 is coupled to an input 145 of the integrator 124 through a feedback path 147. Another input 149 of the integrator 124 is coupled to the midpoint of the voltage divider 18, 20. A capacitor 151 having a value such as 0.1 microfarad couples the integrator input 149 to the power common for high frequency bypass.

At the start of operation, assume that the switch feedback from the NAND gate 127 is low and that the output from the integrator 124 is zero volts. The threshold comparators 128 and 130 and the NAND gate 129 all have high ouputs, and the integrator starts ramping up until its output equals the high threshold value. At that point, the HT comparator 128 switches to a low value which causes the NAND gate 127 to be set high. Since the NAND gate 129 is still low, the gate 127 is latched in a high state.

Accordingly, the high switch feedback causes the integrator to ramp down to the low threshold point at which time the LT comparator 130 switches low. The NAND gate 129 goes high and, with the HT comparator 128 having switched to high with the integrator down ramp, the NAND gate 127 generates a low output to latch the NAND gate 129 high. Swtiching the feedback to the integrator input 149 to a low value reverses the integrator operation to ramp upwardly. The HT comparator 128 then goes high and the cycle is repeated Waveform 161 represents the oscillatory integrator voltage output, referred to as P-P ramp.

The integrator cycling rate, i.e. the oscillator frequency, is determined by the upper and lower threshold voltages, the high and low feedback voltages and the value of integrator resistor 153 (such as 100K) and integrator capacitor 155 (such as 390 pfarads).

In the present embodiment, the integrator 124 and its supporting circuitry ramp up and down between the upper and lower voltage limits + and − 1.25 volts at a frequency approximately equal to 12 KHz.

The voltage divider 132, from which the HTC and LTC comparator reference voltages are obtained, is a series resistance circuit connected between the positive and negative terminals ($+2.5V$ and $-2.5V$ in this case) of the voltage supply 126. It includes a fixed resistor 133A connected to a potentiometer 135A and another fixed resistor 133B connected to a potentiometer 135B.

The HT comparator 128 is referenced from junction 137 between the resistor 133 and the potentiometer 135A. Similarly, the LT comparator 130 is referenced from junction 139. In this case, the resistors and potentiometers 133A, 133B, 135A, and 135B all have a resistance value of 1000 ohms and the comparator reference voltages at the junctions 137 and 139 are respectively $+1.25V$ and $-1.25V$.

An output comparator (OC) 134 is preferably coupled to an output inventor buffer 138 which speeds up the rising leading edge of waveform 163 from the OC 134 to generate an inverted output signal Vdcc for control of the filter switching means 94 of FIG. 4. When Vdcc is high, the filter switching means 94 is on, and when it is low the filter switching means 94 is off.

One of the inputs to the output comparator 134 is the ramp output 161 from the integrator 124. The other output comparator input is a variable reference valued between the HT and LT comparator references and obtained from the tap of a filter frequency adjustment potentiometer 136 (having a resistance such as 250K). The voltage applied across the filter frequency adjustment potentiometer 136 is supplied from taps 135AT and 135BT of the potentiometers 135A and 135B. With the use of the pair of potentiometers 135A and 135B as described, the upper and lower filter frequency adjust limits can be varied by sliding the potentiometer taps 135AT and 135BT. In the present illustrative embodiment, the lowest lower filter frequency limit is set for 10Hz and the highest upper filter frequency limit is set for 100 Hz.

Adjustment of the potentiometer 136 varies the reference D.C. voltage to the output comparator 134, within the limits set by the potentiometers 135A and 135B, to adjust linearly the oscillator ramp time needed to trigger the output comparator 134 to an on condition.

As a result, a pulse train of variable pulse widths is generated for the output Vdcc in dependence on the comparator reference DC voltage from the frequency adjustment potentiometer 136. The frequency is fixed, in this case at 12 KHz, but even if the frequency-period changes up or down, the on/off ratio remains the same with dependence on the refence DC voltage input only. When the ramp level is higher than the DC voltage reference, the output Vdcc is low and vice versa.

Linear adjustment is thus provided for the on/off times of the output signal Vdcc, the duty cycle of the filter switch means 94, and ultimately the tuned frequency of the filter 62 (within the frequency limit range defined by the potemtiometers 135A and 135B). Since the voltage across the frequency adjustment potentiometer floats between the positive and negative power supply terminals within the whole oscillator circuit feedback loop, duty cycle control is achieved with high stability since source voltage, and ambient temperature and other external variations have essentially no effect on the duty cycle control signal Vdcc.

Specifically, variation of the positive and negative power supply voltages and any imbalance between the two has essentially no effect on duty cycle control. The reason for this is that none of the control voltages, i.e. the integrating noninverting input, and the HT and LT and frequency (duty cycle) adjust potentiometer voltages float between the power rails with symmetric spacing maintained ratios relative to each other.

Figure 7:
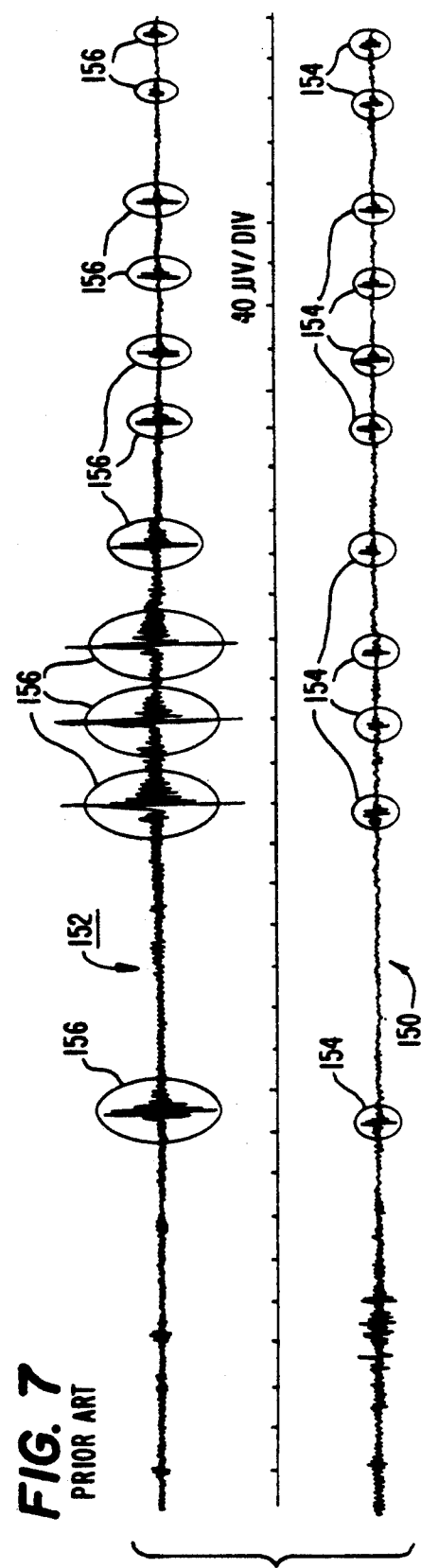
FIG. 7 shows a seismic recording made by a typical prior art detector and a seismic recording made with significantly improved signal detection by a detector structured in accordance with the present invention.

In FIG. 7, there are shown recorder tracings illustrating the improved detection performance provided by use of the present invention. A lower tracing 150 indicates the results produced by a typical prior art system responding to seismic inputs over a certain period of time. An upper tracing 152 indicates the results produced by an embodiment of the present invention responding to the same seismic inputs over the same time period, operating in the band pass mode and tuned to approximately 30 Hz with a 15% bandwidth. The background signal in both tracings 150 and 152 is low frequency (about 10 Hz) ground noise. A person's foot stomping on the ground is registered as "ring" signals 154 in the prior art tracing 150. In the invention embodiment tracing, the same stomping is registered as corresponding and much more easily identified "ring" signals 156.

Figure 6:
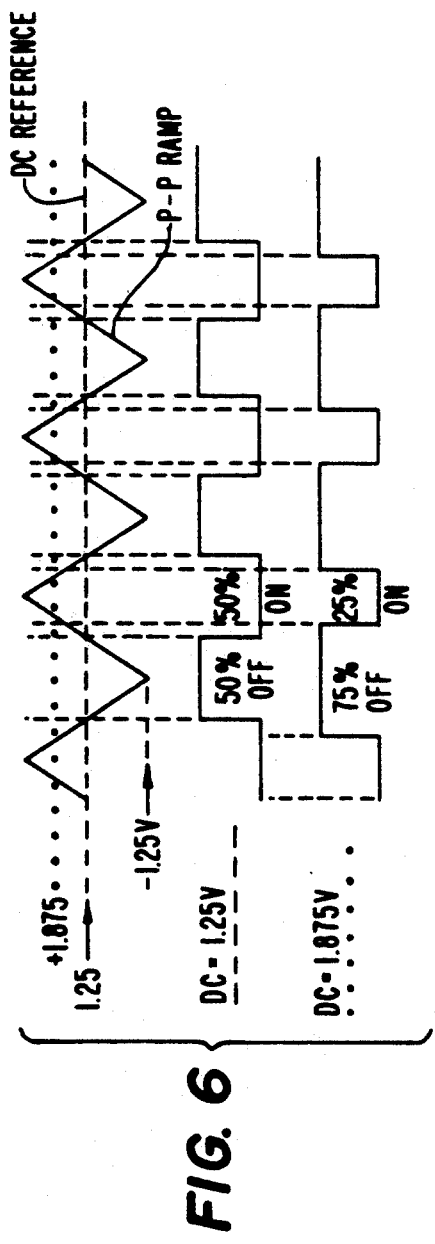
FIG. 6 is a graph showing typical duty cycle control signals employed in the present invention for filter frequency adjustment.

As shown in FIG. 6, the tuned frequency controlling switch 94 is turned on to provide filter capacitor charging current flow when the output comparator 138 is on. The upper graph shows the DC reference and P-P ramp inputs to the output comparator 134. The middle graph illustrates a 50% duty cycle corresponding to a filter resistance multiplier effect of 2; the lower graph shows a 25% on duty cycle corresponding to a filter resistance multiplier effect of 1.5.

The comparators 128, 130, and 134 can for example be embodied by an LM139 quad device. A quad 2 input NAND gate device (4011) can be used to embody the oscillator switch 126. The output speedup buffer 138 can be embodied by a 4011 inverter flip-flop device.

The improvements provided by the present invention enable a survival detector to be characterized with very sharp enhancements of specific low frequency signals or elimination of unwanted low frequency signals with a capability for linear frequency and bandwidth adjustment. In the previously referenced specific case of survivor tapping signals of 22Hz to 44Hz, these signals can be detected with sharp single cycle tuning or, with bandwidth adjustment, through a broader bandwidth search. Overall, better survivor detection is enabled by the present invention in disaster situations.

Various modifications and variations can be made in the survival detection system of the present invention by those skilled in the pertaining art without departing from the scope and spirit of the invention. It is accordingly intended that the present invention embrace such modifications and variations to the extent they come within the scope of the appended claims and their equivalents.

What is claimed is:

1. A survival detection system capable of detecting a frequency survivor generated signal component from ambient frequency signal components in a seismic sensor signal output, said detection system comprising:
    filter circuit means to which the sensor signal output is applied for detection of the survivor generated signal component; said filter circuit means having a plurality of interconnected charging resistor and capacitor components and an output circuit coupled to said resistor and capacitor components to generate the detected survivor signal component;
    switch means connected in charging current paths from said resistors to said capacitors to control the capacitor charging currents; and
    means for controlling the on-off duty cycle of said switch means to control the effective charging current path resistance, the capacitor charging currents and the tuned frequency of said filter circuit means.

2. A survival detection system as set forth in claim 1 wherein said filter circuit means is a twin-tee filter circuit in which the interconnected resistors and capacitors are included in parallel connected low and high pass filter circuits, said low pass filter circuit having a pair of low pass resistors each having a first resistance value and connected between input and output terminals and further having a low pass capacitor connected between a junction between said low pass resistors and a common junction, said high pass filter circuit having a pair of high pass capacitors having a first capacitance value and connected between said input and output terminals and further having a high pass resistor connected between a junction between said high pass capacitors and said common junction, said low pass capacitor having a capacitance value equal to twice said first capacitance value and said high pass resistor having a resistance value equal to one half said first resistance value, and said switch means including first and second switches respectively connected between said low pass resistors and said resistor junction, and at least a third switch connected between said high pass resistor and said common junction, said output terminal coupled to an input of said output circuit, said output circuit having a detected signal output coupled to said filter common junction.

3. A survival detection system as set forth in claim 1 wherein means are provided for adjusting the bandwidth of said filter circuit means.

4. A survival detection system as set forth in claim 2 wherein bandwidth control circuit means are connected between the output of said output circuit and said filter common junction.

5. A survival detection system as set forth in claim 4 wherein said bandwidth control circuit means includes a bandwidth control potentiometer connected to the output of said output circuit, and a buffer amplifier having an input coupled to a tap connection of said bandwidth control potentiometer and an output connected to said filter common junction.

6. A survival detection system capable of detecting a frequency survivor generated signal component from frequency ambient signal components in each of a plurality of seismic sensor signal outputs, each of said sensor signal outputs coupled to an input of a survival detector circuit, and each of said survival detector circuits comprising:
    filter circuit means to which the sensor signal output is applied for detection of the survivor generated signal component; said filter circuit means having a plurality of interconnected charging resistor and capacitor components and an output circuit coupled to said resistor and capacitor components to generate the detected survivor signal component;

switch means connected in charging current paths from said resistors to said capacitors to control the capacitor charging currents; and means for controlling the on-off duty cycle of said switch means to control the effective charging current path resistance, the capacitor charging currents and the tuned frequency of said filter circuit means.

7. A survival detection system as set forth in claim 6 wherein said filter circuit means is a twin-tee filter circuit in which the interconnected resistors and capacitors are included in parallel connected low and high pass filter circuits, said low pass filter circuit having a pair of low pass resistors each having a first resistance value and connected between input and output terminals and further having a low pass capacitor connected between a junction between said low pass resistors and a common junction, said high pass filter circuit having a pair of high pass capacitors having a first capacitance value and connected between said input and output terminals and further having a high pass resistor connected between a junction between said high pass capacitors and said common junction, said low pass capacitor having a capacitance value equal to twice said first capacitance value and said high pass resistor having a resistance value equal to one half said first resistance value, and said switch means including first and second switches respectively connected between said low pass resistors and said resistor junction, and at least a third switch connected between said high pass resistor and said common junction, said output terminal coupled to an input of said output circuit, said output circuit having a detected signal output coupled to said filter common junction.

8. A survival detection system as set forth in claim 1 wherein circuit means are provided for selecting band stop or band pass operation of said filter circuit means.

9. A survival detection system as set forth in claim 2 wherein circuit means are provided for selecting band stop or band pass operation of said filter circuit means.

10. A survival detection system as set forth in claim 9 wherein said selecting circuit means includes an output buffer amplifier circuit having one of its inputs coupled to said filter detector output, and selector switch means for coupling another input to said output buffer amplifier to ground for bandstop operation or to the sensor signal input for bandpass operation.

11. A survival detection system as set forth in claim 1 or 3 or 6 wherein said duty cycle controlling means comprises an oscillator circuit for generating an oscillatory output at a frequency substantially higher than the frequencies of the seismic sensor signal components, and means for generating a variable duty cycle control signal from said oscillatory output for application to said switch means.

12. A survival detection system as set forth in claim 2 or 4 or 7 wherein said duty cycle controlling means comprises an oscillator circuit for generating an oscillatory output at a frequency substantially higher than the frequencies of the seismic sensor signal components, and means for generating a variable duty cycle control signal from said oscillatory output for application to said switch means.

13. A survival detection system as set forth in claim 11 wherein said oscillator circuit includes an integrator amplifier generating said oscillatory output and having an input connectable to the positive or negative polarity of a voltage source, and means for responding to the output from said integrator amplifier to switch the polarity of integrator amplifier input and thereby provide the drive for oscillatory operation of said oscillator circuit, and said duty cycle control signal generating means including means for generating a variable reference voltage and means for comparing said variable reference voltage and said oscillatory output to generate an on/off duty cycle control signal having an on time dependent on said variable reference voltage.

14. A survival detection system as set forth in claim 13 wherein said variable reference voltage generating means includes a voltage divider connected between the positive and negative voltage source polarities, and a filter frequency control potentiometer connected across predetermined voltage divider points and having its tap connected to said comparing means.

15. A survival detection system as set forth in claim 14 wherein said voltage divider is a series resistive circuit having a first fixed resistor connected to a first divider potentiometer which in turn is connected to a second divider potentiometer and a second fixed resistor, said filter frequency control potentiometer connected across the taps of said voltage divider potentiometers to provide variable control of the frequency limits of said frequency control potentiometer.

16. A survival detection system as set forth in claim 13 wherein said polarity switching means includes a high threshold comparator and a low threshold comparator referenced to predetermined respective positive and negative voltages derived from the voltage source and coupled to said integrator output, and a set-reset latch coupled to the outputs from said threshold comparators and coupled to the integrator input to switch the polarity of the source voltage applied to the integrator input and thereby drive said oscillator circuit at a characteristic operating frequency.

17. A survival detection system as set forth in claim 14 wherein said polarity switching means includes a high threshold comparator and a low threshold comparator referenced to predetermined respective positive and negative voltages derived from the voltage source and coupled to said integrator output, and a set-reset latch coupled to the outputs from said threshold comparators and coupled to the integrator input to switch the polarity of the source voltage applied to the integrator input and thereby drive said oscillator circuit at a characteristic operating frequency.

18. A survival detection system as set forth in claim 12 wherein said oscillator circuit includes an integrator amplifier generating said oscillatory output and having an input connectable to the positive or negative polarity of a voltage source, and means for responding to the output from said integrator amplifier to switch the polarity of integrator amplifier input and thereby provide the drive for oscillatory operation of said oscillator circuit, and said duty cycle control signal generating means including means for generating a variable reference voltage and means for comparing said variable reference voltage and said oscillatory output to generate an on/off duty cycle control signal having an on time dependent on said variable reference voltage.

19. A survival detection system as set forth in claim 18 wherein said variable reference voltage generating means includes a voltage divider connected between the positive and negative voltage source polarities, and a filter frequency control potentiometer connected across predetermined voltage divider points and having its tap connected to said comparing means.

20. A survival detection system as set forth in claim 19 wherein said voltage divider is a series resistive circuit having a first fixed resistor connected to a first divider potentiometer which in turn is connected to a second divider potentiometer and a second fixed resistor, said filter frequency control potentiometer connected across the taps of said voltage divider potentiometers to provide variable control of the frequency limits of said frequency control potentiometer.

21. A survival detection system as set forth in claim 18 wherein said polarity switching means includes a high threshold comparator and a low threshold comparator referenced to predetermined respective positive and negative voltages derived from the voltage source and coupled to said integrator output, and a set-reset latch coupled to the outputs from said threshold comparators and coupled to the integrator input to switch the polarity of the source voltage applied to the integrator input and thereby drive said oscillator circuit at a characteristic operating frequency.

22. A survival detection system as set forth in claim 19 wherein said polarity switching means includes a high threshold comparator and a low threshold comparator referenced to predetermined respective positive and negative voltages derived from the voltage source and coupled to said integrator output, and a set-reset latch coupled to the outputs from said threshold comparators and coupled to the integrator input to switch the polarity of the source voltage applied to the integrator input and thereby drive said oscillator circuit at a characteristic operating frequency.

* * * * *